United States Patent [19]

Kessler, Jr.

[11] 4,327,370
[45] Apr. 27, 1982

[54] RESILIENT CONTACT RING FOR PROVIDING A LOW IMPEDANCE CONNECTION TO THE BASE REGION OF A SEMICONDUCTOR DEVICE

[75] Inventor: Sebastian W. Kessler, Jr., Lancaster, Pa.

[73] Assignee: RCA Corporation, New York, N.Y.

[21] Appl. No.: 53,510

[22] Filed: Jun. 28, 1979

[51] Int. Cl.³ .................... H01L 23/42; H01L 23/44; H01L 23/46
[52] U.S. Cl. ........................................ 357/79; 357/68; 357/81; 357/82
[58] Field of Search ...................... 357/66, 79, 81, 82, 357/68, 74

[56] References Cited

U.S. PATENT DOCUMENTS

| | | |
|---|---|---|
| 2,551,630 | 8/1942 | Page . |
| 2,702,376 | 2/1955 | Brush . |
| 3,452,254 | 6/1969 | Boyer .................................. 357/79 |
| 3,489,857 | 1/1970 | Dewarga . |
| 3,581,163 | 5/1971 | Eriksson .............................. 357/66 |
| 3,736,474 | 5/1973 | Sias ...................................... 357/66 |
| 3,739,235 | 6/1973 | Kessler . |
| 3,852,803 | 12/1974 | Walmet et al. ...................... 357/82 |
| 3,852,805 | 12/1974 | Brzozowski ........................ 357/82 |
| 3,978,518 | 8/1976 | Kessler et al. ...................... 357/82 |
| 4,126,879 | 11/1978 | Kessler et al. ...................... 357/82 |

Primary Examiner—Andrew J. James
Attorney, Agent, or Firm—Eugene M. Whitacre; Dennis H. Irlbeck; Vincent J. Coughlin, Jr.

[57] ABSTRACT

A semiconductor device comprises a body of semiconductor material having a base-emitter structure on a first surface of the body. The base emitter structure includes a plurality of discrete emitter regions interdigitated with a base region having a base contact on the base region. A base contact ring is attached coaxially to the base contact. An improved base terminal structure comprises a conductive base feed-through ring having a base terminal integral with the feed-through ring. The base feed-through ring is spaced from and concentric with the base contact ring. The base terminal structure further includes a resilient contact ring attached to the base contact ring and the base feed-through ring to provide a low impedance interconnection between the base contact ring and the base feed-through ring.

13 Claims, 4 Drawing Figures

RESILIENT CONTACT RING FOR PROVIDING A LOW IMPEDANCE CONNECTION TO THE BASE REGION OF A SEMICONDUCTOR DEVICE

The Government has rights in this invention pursuant to Contract No. N62269-78-C-0014, awarded by the Department of the Navy.

BACKGROUND OF THE INVENTION

The present invention relates to power transistors and transcalent power devices incorporating such transistors.

The transcalent device is an operable electronic device having an integral cooling system connected to it. Such cooling systems may include a circulating liquid coolant or at least one heat pipe. Many transcalent devices which operate at high current comprise a semiconductor wafer sandwiched between two heat pipes to provide additional cooling of the semiconductor wafer. The two heat pipes are usually joined together with a structural member which protects the edge of the semiconductor device and maintains the semiconductor device under compression. The heat pipes in transcalent devices are in thermal and electrical contact with the semiconductor device.

In a transcalent transistor, means are required to provide for the attachment of a control of gating lead to the base region of the transistor. In a prior art device such as that shown in U.S. Pat. No. 3,739,235 issued to S. W. Kessler Jr. on June 12, 1973 entitled "Transcalent Semiconductor Device," a gate lead is bonded between a gate electrode and a small feed-through pin which is used as the base terminal of a transcalent thyristor. However, in semiconductor devices in which the base current exceeds 20 amperes continuous and 100 amperes pulsed, the feed-through pin and gate lead are inadequate to handle the large current.

SUMMARY OF THE INVENTION

A semiconductor device comprises a body of semiconductor material having a base-emitter structure on a first surface thereof. The base-emitter structure includes a plurality of discrete emitter regions interdigitated with a base region having a base contact thereon.

An improved base terminal means comprises a conductive base feed-through ring including a base terminal. The base feed-through ring is concentric with and spaced from the base contact. A resilient contact ring is attached to the base contact and the base feed-through ring to provide a low impedance interconnection between the base contact and the base feed-through ring.

DETAILED DESCRIPTION OF THE INVENTION

Figure 1:
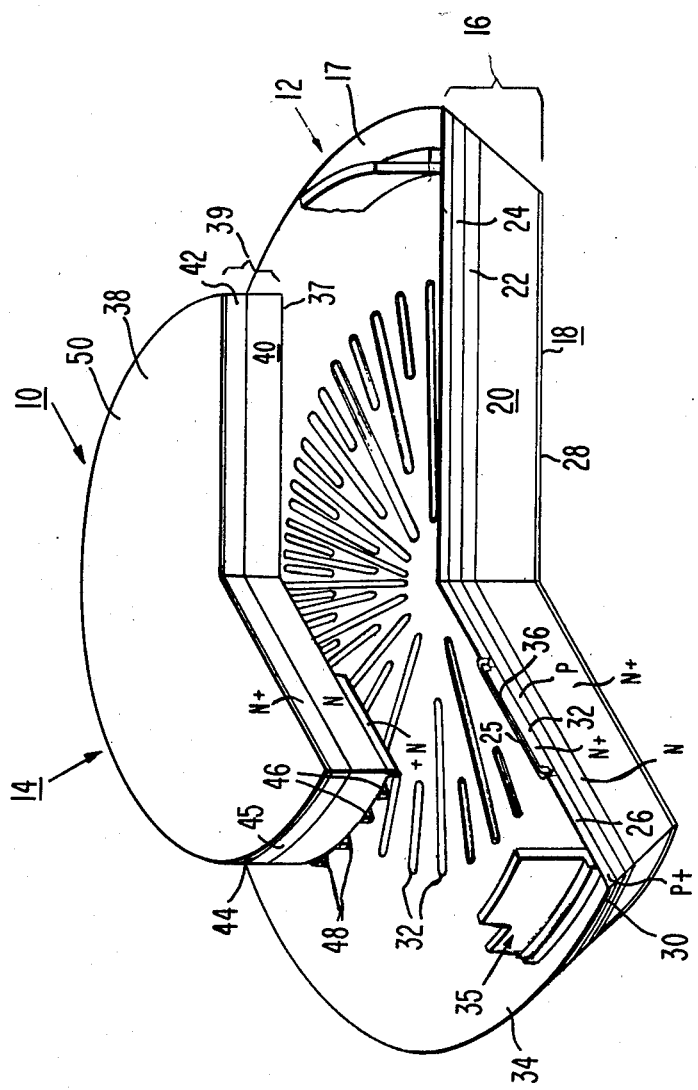
FIG. 1 is a sectional perspective view of a power device according to the present invention.

With reference to FIG. 1, a power device 10 includes a semiconductor transistor 12 and a ballast resistor 14 thermally and electrically attached to one another. For the purpose of illustration, the transistor 12 and resistor 14 have been separated in FIG. 1.

The transistor 12 is in the form of a wafer 16 having a first major surface 17 and a second, oppositely disposed, major surface 18. The wafer 16 is fully described in U.S. Pat. No. 4,126,879 issued to S. W. Kessler Jr. on Nov. 21, 1978 entitled "Semiconductor Device With Ballast Resistors Adapted for a Transcalent Device" which is incorporated herein by reference. The wafer 16 comprises a relatively heavily doped first layer 20 of a first conductivity type material, for example, N type, and a relatively moderately doped second layer 22 on the first region. The second layer 22 is of the same conductivity type as the first layer 20 and forms a collector. The first layer 20 interconnects the collector layer 22 with a collector contact 28 on the second major surface 18, which may be comprised, for example, of a single alternate layer of paladium, tungsten, and nickel.

A relatively moderately doped third layer 24 of an opposite conductivity type is on the collector layer 22 and forms the base of the semiconductor transistor 12. A relatively heavily doped fourth layer 26 of the opposite conductivity type is contiguous with the base layer 24. The fourth layer 26 is a base interconnection region for the transistor 12 and has a base contact 30 thereon comprised of a single alternate layer of paladium, tungsten, and nickel, for example. The base contact 30 has a major surface 34.

Located in the fourth layer 26 are a plurality of discrete relatively heavily doped semiconductor emitter regions 32 of the first conductivity type. Each emitter region 32 is interdigitated with the base interconnection region or fourth layer 26, is contiguous with the base layer 24, and is surrounded by a moat-like aperture 25 to isolate the region from the fourth layer and the other emitter regions. Each of the emitter regions 32 may be shaped in the form of an elongated finger having a major surface coated with an emitter contact 36 formed by a single alternate layer of paladium, tungsten and nickel, for example. The emitter regions 32 are arranged in a radially symmetrical pattern centrally located on the surface 34 of the transistor 12. The surface of each emitter contact 36 is flush with the major surface 34 of the transistor 12.

An electrically conductive ring 35 of kovar or other suitable material is attached to a major surface 34 of the base contact 30 so as to surround the emitter regions 32 and the ballast resistor 14. The ring 35 serves as a base electrical contact 30 for the device and distributes the base current evenly around the wafer 16.

The ballast resistor 14 comprises a first major surface 37 and an oppositely disposed second major surface 38. The resistor 14 is formed from a uniformly doped semiconductor wafer 39 in which ohmic contacts are diffused. The body of the wafer 39 is comprised of a relatively moderately doped first resistor layer 40 of the first conductivity type material and a relatively heavily doped second resistor layer 42 also of the first conductivity type material and contiguous with the first resistor layer 40. Deposited on the second resistor layer 42 is a resistor contact 44, similar to the base contact 30, which serves as a base contact for the power device 10. The wafer 39 further comprises a plurality of integral mesa fingers 46 formed of a layer of relatively heavily doped first conductivity type material and extending from the first resistor layer 40. The fingers 46 are arranged in a pattern which forms a mirror symmetric image of the emitter region pattern and extends in from the lateral edge 45 of the wafer 38. A finger contact 48 comprised of a heavy gold plating on alternate layers of paladium, tungsten and nickel is deposited on the bottom surface of the mesa fingers 46. The resistance of the ballast resistor 14 is determined by the bulk resistivity and thickness of the first layer 40.

The resistor contact 44 has a planar surface 50 which is adapted to receive a means for conducting heat away from and making electrical contact with, the resistor 14. Similarly, the collector contact 28 is also planar and adapted to receive another means for conducting heat away from, and making electrical contact with, the transistor 12.

Although in the preferred embodiment shown in FIG. 1, the transistor 12 is an NPN transistor and the ballast resistor 14 is comprised of an N type semiconductor wafer, a P type ballast resistor could be used. Alternately, the transistor 12 may be a PNP transistor with a P type ballast resistor 14 or an N type ballast resistor.

The ballast resistor 14 is completely isolated from the base ring 35 as well as from the base contact 30. Additionally, the ballast resistor 14 provides means for connecting the plurality of emitter regions 32 to a planar contact surface 50 of the resistor contact 44.

Figure 2:
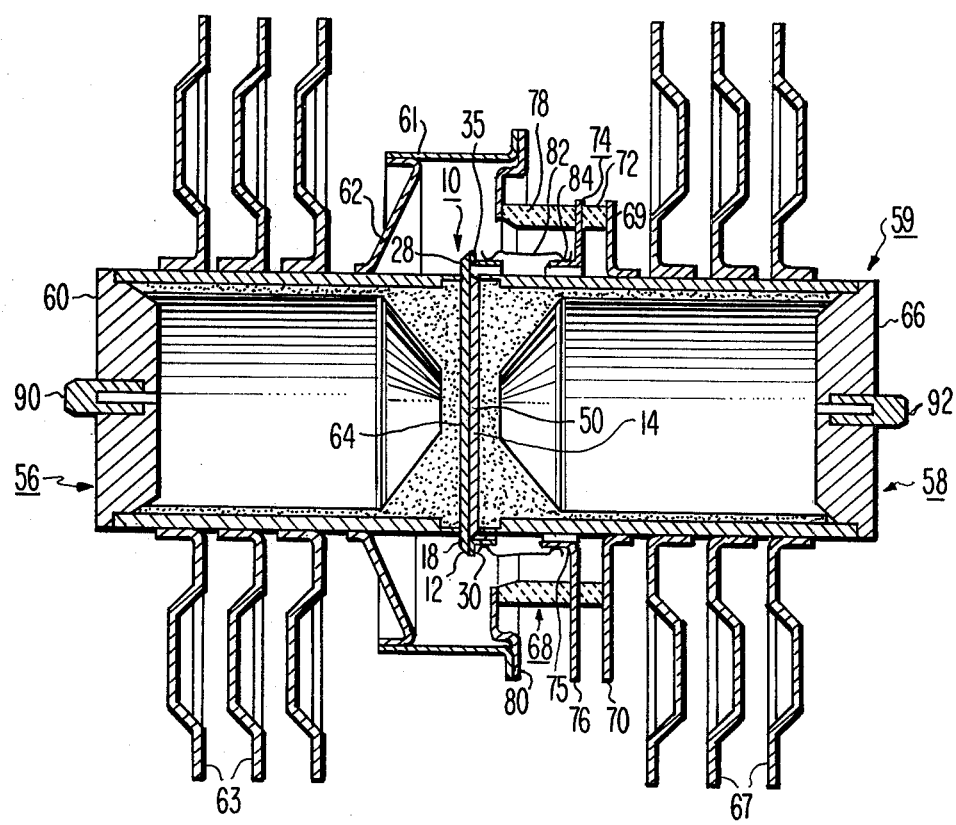
FIG. 2 is a longitudinal sectional view of the device of FIG. 1 with heat pipes attached.

With reference to FIG. 2, the power device 10 is sandwiched between two heat pipe assemblies 56 and 58 to form a transcalent device 59 similar to that disclosed in U.S. Pat. No. 3,978,518, entitled "Reinforced Transcalent Device" issued on Aug. 31, 1976 to S. W. Kessler Jr. et al., which is incorporated herein by reference. The first heat pipe assembly 56 comprises a first collector heatpipe 60, a weld flange 61 and a conical connecting flange 62 attached between the collector heat pipe 60 and the weld flange 61. A plurality of louvered fins 63 complete the first heat pipe assembly. The collector heat pipe 60 is in thermal and electrical contact with the second major surface 18 which includes the collector contact 28 of the transistor 12. The thermal and electrical contact may be provided by attaching, for example by soldering, the collector contact 28 and the end 64 of the heat pipe 60 to one another. The base contact ring 35 may be simultaneously soldered to the base contact 30 of the transistor 12. The soldering is done in a hydrogen atmosphere to prevent oxidation and gas voids that would adversely affect the heat transfer and the electrical conductivity of the solder joints.

The second heat pipes assembly 58 comprises a second or emitter heat pipe 66, a plurality of louvered fins 67 and a brazed ceramic-to-metal envelope assembly 68 attached to the emitter heat pipe 66. The envelope assembly 68 includes, in the order of attachment to the emitter heat pipe 66: an annular auxiliary emitter lead flange 69 having at least one terminal 70, an annular base emitter ceramic insulator 72, an annular base feed-through ring 74 having at least one integral terminal 76, an annular base-collector ceramic insulator 78 and an annular final weld flange 80. The terminals 70 and 76 may be, for example, a "Faston" terminal such as that made by Amp Inc., Harrisburg, Pennsylvania. The ceramic insulators 72 and 78 are made of 92.5% aluminum oxide and are metalized and plated on the sealing surface before brazing. The metalizing, plating and blazing procedures are well known in the art and will not be described.

Figure 3:
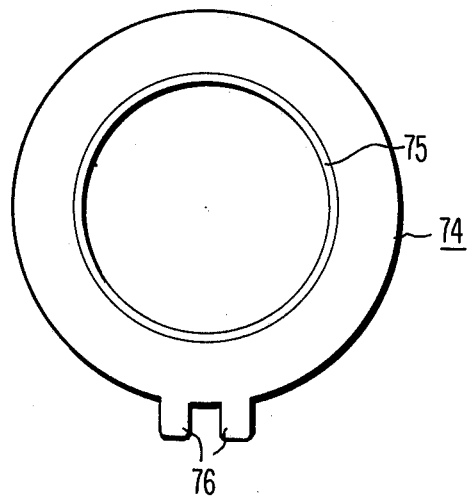
FIG. 3 is an enlarged elevated view of a base feed-through ring according to the present invention.

The base feed-through ring 74 is shown in FIGS. 2 and 3. Preferably, the ring 74 is of a metal such as "Kovar" made by Carpenter Steel Co., Reading, Pennsylvania; however, any suitable metal which may be brazed to the ceramic insulator may be used. The ring 74 is preferably "L-shaped" in cross-section as shown in FIG. 2 with one leg of the "L" forming a projection 75 extending from the inside circumference of the ring such that it is perpendicular to the ring ceramic-to-metal sealing surfaces. As shown in FIG. 2, the base feed-through ring 74 is concentric with and spaced from the base contact ring 35. The projection 75 of the feed-through ring 74 is directed toward the base contact ring 35. The distal end of the projection 75 is slightly beveled.

In the prior art, for example in my U.S. Pat. No. 3,739,235 discussed above and in U.S. Pat. No. 3,489,957 issued to DeWarga on Jan. 13, 1970 entitled, "Semiconductor Device in a Sealed Package," the base or contact lead is a conductive wire attached between the base of the device and the base terminal. Such a lead, however, is inadequate in semiconductor devices in which the base current exceeds 20 amperes continuous and 100 amperes pulsed because the high electrical impedance of the lead causes a phase shift between the voltage component and the current component of the switching signal to the base. It is thus desirable to find a low impedance means of connecting the base of the device to the base terminal tab 76. It is also desirable to eliminate additional soldering within the device envelope in order to improve the mechanical reliability of the device and eliminate electrical arcing.

Figure 4:
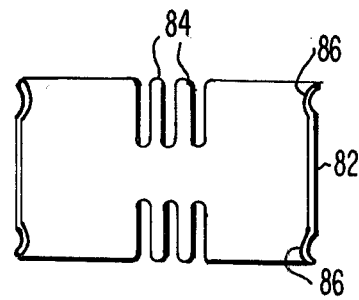
FIG. 4 is an enlarged cross-sectional view of a resilient contact ring according to the present invention.

To obtain a low impedance, high reliability electrical interconnection between the base feed-through ring 74 and the base contact ring 35, a resilient contact ring 82 such as that shown in FIG. 4 is attached coaxially between the feed-through ring 74 and the contact ring 35. The resilient contact ring 82 has a substantially larger area to conduct current than the prior art lead and may be made of a high electrical conducting, resilient metal such as beryllium-copper alloy, phosphor bronze, nickel-silver alloy, beryllium-nickel alloy, stainless steel, or carbon steel, although beryllium copper is preferred. The resilient contact ring 82 may include a plurality of spring fingers 84 on at least one end of the ring. To improve the electrical conductivity, the spring fingers may be plated or clad with a high conductivity metal such as gold, silver or copper. The contact resistance of the resilient contact ring 82 may be decreased by limiting the plating or cladding to localized deposits on the contact tips 86 of the spring fingers 84.

With reference to FIGS. 1 and 2, device assembly is accomplished by aligning the mesa fingers 46 of the ballast resistor 14 with the emitter fingers 32 on the transistor 12. A silicon rubber cement such as that sold under the trademark "RTV" by General Electric Company may be used at the edges of the ballast resistor 14 after alignment to maintain the position of the resistor 14 and the transistor 12 with respect to one another. Final assembly is made by attaching the resilient contact ring 82 onto the base contact ring 35 of the first heat pipe assembly 56. If the resilient contact ring 82 has a plurality of spring fingers 84, the fingers are spread to permit the contact ring 82 to engage the base contact ring 35. The second heat pipe assembly 58 is lowered onto the first heat pipe assembly 56 so that the spring fingers 84 on the distal end of the resilient contact ring 82 engage the beveled, perpendicular projection 75 of the base feed-through ring 74.

A resilient contact ring 82 with spring fingers at one end only may be attached between the base contact ring 35 and the base feed-through ring 74 by soldering or brazing the non-spring fingered ends of the resilient contact ring to the base contact ring 35 or the base feed-through ring 74 or the base contact area 30 of the transistor 12. Such means of interconnection are well known in the art and will not be described.

The height of the resilient contact ring 82 is substantially equal to the perpendicular spacing between the base contact ring 35 and the base feed-through ring 74 when the second heat pipe assembly 58 is positioned on the first heat pipe assembly 56. This height assures that the resilient contact ring cannot become dislodged during operation of the device.

Once proper alignment of the ballast resistor 14 and the transistor 12 has been attained, and the resilient contact ring 82 is attached to form a coaxial, low impedance interconnection between the base contact ring 35 and the base feed-through ring 74 the device is clamped together so that the weld flange 61 abuts the final weld flange 80. While the device is clamped, the first heat pipe assembly 56 and the second heat pipe assembly 58 are joined in a manner similar to that disclosed in U.S. Pat. No. 3,978,518. The device 10 is held in compression between the two heat pipe assemblies.

Electrical connections to the transistor are provided by the auxiliary emitter terminal 70, the base feed-through ring terminal 76 and a pair of studs 90 and 92. The stud 90 provides a high current electrical contact to the first or collector heat pipe 60 which, in turn, is soldered to the collector 28 of the transistor 12, and the stud 92 provides a high current electrical contact to the second or emitter heat pipe 66 which is connected to the electrical contact surface 50 of the ballast resistor 14 which is the electrical interconnector to the emitter regions 32.

I claim:

1. In a semiconductor device comprising a body of semiconductor material having first and second major surfaces, said first surface including an emitter-base structure having a plurality of discrete emitter regions interdigitated with a base region, said base region having a base contact ring thereon, and base terminal means electrically connected to said base contact ring, the improvement wherein said base terminal means comprise:
   a conductive base feed-through ring including a base terminal, said base feed-through ring being concentric with and spaced from said base contact ring and having projecting means extending from and around the entire inner circumference of said base feed-through ring, said projecting means being directed towards said base contact ring, and
   a resilient contact ring disposed between said base contract ring and said projecting means of said base feed-through ring thereby providing a low impedance electrical interconnection therebetween.

2. The device as in claim 1 wherein the resilient contact ring includes a plurality of spring fingers on at least one end of the resilient contact ring, each of said spring fingers having a contact tip.

3. The device as in claim 1 wherein the resilient contact ring has a height substantially equal to the perpendicular spacing between the base contact and the base feed-through ring so that the resilient contact ring cannot become dislodged during device operation.

4. The device as in claim 2 wherein the resilient contact ring may be fabricated from a metal selected from the group consisting of beryllium-copper alloy, phosphor bronze, nickel-silver alloy, beryllium-nickel alloy, stainless steel and carbon steel.

5. The device as in claim 2 wherein said spring fingers may be plated or clad with a metal selected from the group consisting of gold, silver or copper.

6. The device as in claim 5 wherein said spring finger contact tips are plated or clad.

7. The device as in claim 1 wherein said base feed-through ring has substantially flat ceramic-to-metal sealing surfaces and said projecting means includes a projection extending generally perpendicularly to said sealing surfaces of the feed-through ring so as to form a substantially "L-shaped" cross-section.

8. In a transcalent semiconductor device comprising
   a first body of semiconductor material having first and second major opposing surfaces, said first surface including an emitter-base interconnection structure having a plurality of discrete emitter regions interdigitated with a base interconnection region, said base interconnection region having a base contact thereon,
   an electrically conductive base contact ring attached coaxially to said base contact,
   a second body of semiconductor material forming a resistor, said second body having opposed first and second major surfaces and a plurality of mesa fingers extending from the first major surface in a substantially mirror symmetrical pattern with respect to the emitter regions of the first body,
   a first heat pipe in electrical and thermal contact with the second major surface of the first body,
   a second heat pipe in electrical and thermal contact with the second major surface of the second body so as to sandwich the first and second bodies between the first and second heat pipes, and
   base terminal means electrically insulated from and disposed between the first and second heat pipes, said base terminal means being electrically connected to said base contact ring, the improvement comprising:
   a conductive base feed-through ring including a base terminal, said base feed-through ring being concentric with and spaced from said base contact ring and having projecting means extending from and around the entire inner circumference of said base feed-through ring, said projecting means being directed towards said base contact ring, and
   a resilient contact ring having a plurality of spring fingers on at least one end thereof, each of said spring fingers having a contact tip, said resilient contact ring being disposed coaxially between said base contact ring and said projecting means of said base feed-through ring thereby providing a low impedance electrical interconnection therebetween.

9. The device as in claim 8 wherein the resilient contact ring has a height substantially equal to the perpendicular spacing between the base contact ring and the base feed-through ring so that the resilient contact ring cannot become dislodged during device operation.

10. The device as in claim 9, wherein the resilient contact ring may be fabricated from a metal selected from the group consisting of beryllium-copper alloy, phosphor bronze, nickel-silver alloy, beryllium-nickel alloy, stainless steel and carbon steel.

11. The device as in claim 8 wherein the spring fingers may be plated or clad with a metal selected from the group consisting of gold, silver or copper.

12. The device as in claim 11 wherein said spring finger contact tips are plated or clad.

13. The device as in claim 8 wherein the base feed-through ring has an "L-shaped" cross-section characterized by substantially flat ceramic-to-metal sealing surfaces and a projection extending generally perpendicularly to said sealing surfaces of the feed-through ring.

* * * * *